United States Patent [19]

Sakashita

[11] Patent Number: 5,384,275
[45] Date of Patent: Jan. 24, 1995

[54] METHOD OF MANUFACTURING A SEMICONDUCTOR INTEGRATED CIRCUIT DEVICE, AND AN ELECTRONIC CIRCUIT DEVICE

[75] Inventor: Kazuhiro Sakashita, Itami, Japan
[73] Assignee: Mitsubishi Denki Kabushiki Kaisha, Tokyo, Japan
[21] Appl. No.: 99,594
[22] Filed: Jul. 30, 1993

[30] Foreign Application Priority Data

Aug. 20, 1992 [JP] Japan ............................ 4-221313

[51] Int. Cl.6 .................. H01L 27/00; G06F 7/38
[52] U.S. Cl. ............................ 437/51; 326/38; 326/39
[58] Field of Search ............ 437/48, 51; 307/465; 257/202

[56] References Cited

U.S. PATENT DOCUMENTS 4,935,734  6/1990  Austin ........................... 307/465

FOREIGN PATENT DOCUMENTS 3606406  8/1986  Germany .
3630835  4/1987  Germany .
3726570  2/1989  Germany .
4035405  5/1991  Germany .
62-115844 5/1987 Japan .
63-1114  1/1988  Japan .

*Primary Examiner*—Tom Thomas
*Attorney, Agent, or Firm*—Oblon, Spivak, McClelland, Maier, & Neustadt

[57] ABSTRACT

By the disclosed apparatus, the method and the electronic circuit device employing the disclosed apparatus, a configurable semiconductor integrated circuit device is manufactured in a reduced time. A regular logic input/output terminal (6) of a configurable semiconductor integrated circuit device (FPGA) (1) is connected to a data processing apparatus (52) through an interface circuit (51). On a magnetic disk (55), logic function specifying basic data are stored which define basic logic functions which are attainable with circuit diagram data and by the FPGA (1). The data processing apparatus (52) generates logic function specifying final data based on the circuit diagram data while utilizing basic logic operations of the FPGA (1) which is loaded with a logic. Since the basic logic operations of the logic-loaded FPGA (1) are used in generating the logic function specifying final data, the FPGA (1) is manufactured in a reduced time.

17 Claims, 12 Drawing Sheets

METHOD OF MANUFACTURING A SEMICONDUCTOR INTEGRATED CIRCUIT DEVICE, AND AN ELECTRONIC CIRCUIT DEVICE

BACKGROUND OF THE INVENTION

1. Field of the Invention

The present invention relates to an apparatus for and a method of manufacturing a configurable semiconductor integrated circuit device to which a logic is set by providing the configurable semiconductor integrated circuit device with logic function specifying data. The present invention also relates to an electronic circuit device employing such an apparatus.

2. Description of the Background Art

Fine processing technique for fabrication of a semiconductor device has been developing at a breath-taking speed in recent years, and now, it is possible to form on a single chip a logic circuit which is equivalent to hundreds thousand gates. Improvement in electronic devices which use these increasingly fine circuits has also been rapid. Product cycle becomes shorter and shorter, with which development of a new product in a reduced time receives greatly increased emphasis. Under these circumstances, of various semiconductor device products, those which are suitable for less volume production of many variations, such as a gate array, are becoming essential elements for electronic devices. On the other hand, recent technology development has yielded a configurable semiconductor integrated circuit device called "Field Programmable Gate Array" (abbreviated to "FPGA"). This configurable semiconductor integrated circuit device realizes different logic functions when provided with logic function specifying data which are loaded by a user in a single chip, and therefore, contributes as a key part to quick development of a new electronic device.

A configurable semiconductor integrated circuit device is disclosed in detail, for example, in Japanese Laid-Open Gazette No. 62-115844 (U.S. Pat. No. 4,868,419) and Japanese Laid-Open Gazette No. 63-1114 (U.S. Pat. No. 845, 287).

FIG. 8 is a block diagram showing general concept of a conventional configurable semiconductor integrated circuit device. As shown in FIG. 8, logic elements 2 and memory elements 3 are formed in a configurable semiconductor integrated circuit device 1. The logic elements 2 and the memory elements 3 are connected to each other by connection wires 8. Through regular logic input/output terminals 6, regular logic data are transferred into and out of the logic elements 2. The memory elements 3 receive logic function specifying data through logic function specifying data input terminals 4 and receive an operation mode control signal through operation mode control terminals 5.

In using the configurable semiconductor integrated circuit device, first, an operation mode control signal which calls for a logic function setting mode is given to the memory elements 3 through the operation mode control terminals 5 so that the memory elements 3 enter the logic function setting mode. Next, logic function specifying data which call for desired logic function are given to the memory elements 3 through the logic function specifying data input terminals 4, thereby storing the logic function specifying data in the memory elements 3.

Following this, the operation mode control signal for invoking a regular operation mode is fed to the memory elements 3 through the operation mode control terminals 5 and the memory elements 3 enter the regular operation mode. As a result, the configurable semiconductor integrated circuit device 1 is made ready to execute, through the regular logic input/output terminals 6, logic operations which correspond to the logic function specifying data stored in the memory elements 3.

Thus, even with the same construction, when provided with different logic function specifying data stored in the memory elements 3, the configurable semiconductor integrated circuit device realizes utterly different logic operations. Hence, when a semiconductor device manufacturer needs to produce semiconductor integrated circuits for unspecified applications for a number of different customers, such configurable semiconductor integrated circuit devices are an answer.

This also means that the configurable semiconductor integrated circuit devices can be mass produced as unspecified products, which makes it possible for the manufacturer to lower the price of the products. On the other hand, the user can enjoy an advantage of the configurable semiconductor integrated circuit device that the device alone works as semiconductor integrated circuits having utterly different logics only if the logic function specifying data stored in the memory elements 3 are changed. Moreover, unlike a gate array, complex fabrication process for realizing desired logic functions is not necessary; what is necessary is to set the logic function specifying data in the memory elements 3. Hence, the user of the configurable semiconductor integrated circuit device can develop a semiconductor integrated circuit device which attains wanted logic functions in a reduced time and at less cost.

The configurable semiconductor integrated circuit devices as above are classified into those in which the memory elements 3 are formed by fuse ROMs so that the logic function specifying data can be written into the memory elements 3 only once and those in which the memory elements 3 are formed by rewritable EEPROMs and RAMs so that the logic function specifying data can be written into the memory elements 3 for a plurality of times. The configurable semiconductor integrated circuit devices hereinafter referred to are the latter type in which the logic function specifying data can be written into the memory elements 3 for a plurality of times.

To obtain a semiconductor integrated circuit device having a desired logic function through use of the configurable semiconductor integrated circuit device, generation of logic function specifying data with which the desired logic function is important.

FIG. 9 is an explanatory diagram showing the flow how the logic function specifying data are generated.

Referring to FIG. 9, first, in a logic designing step 11, a logic circuit which realizes a desired logic function is designed as is customarily done in designing an ordinary logic circuit, whereby circuitry diagram data 21 are generated which define the desired logic circuit. In a subsequent arranging and wiring step 12, logic function specifying data 22 are developed from the circuitry diagram data 21.

FIG. 10 is a block diagram showing the details of the arranging and wiring step 12. With reference to FIG. 10, first, the circuitry diagram data 21 are entered and so are data 31 (hereinafter referred to as "FPGA basic data 31") which define basic elements of the configurable semiconductor integrated circuit device. The circuitry diagram data 21 are made based on general logic elements. Meanwhile, only limited logic elements can form, as they are, logic elements of the configurable semiconductor integrated circuit device. Basic logic elements realized in the configurable semiconductor integrated circuit device are registered as the FPGA basic data 31.

In a logic element change step 121, the circuitry diagram data 21 are converted while referring to the FPGA basic data 31 into circuitry data 32 ("FPGA circuitry diagram data 32" hereinafter) for the configurable semiconductor integrated circuit device which consists only of the basic logic elements which are defined in the FPGA basic data 31.

Next, in an arranging step 122, while referring to FPGA construction defining data 33 which define the chip structure of the configurable semiconductor integrated circuit device (the number, the arrangement and structure, the area for wiring of the inner logic element groups 2), the basic logic elements defined on the FPGA circuitry data 32 are assigned to the logic elements 2 of the configurable semiconductor integrated circuit device 1, thereby developing arrangement data 34.

Following this, in a wiring step 123, the connections between the basic logic elements which are assigned by the arranging data 34 are realized in accordance with the FPGA circuitry data 32 and with reference to the FPGA construction defining data 33 and the arranging data 34. As a result, the logic function specifying data 22 are generated which will be then outputted.

The arranging step 122 and the wiring step 123 are attained using a known algorithm which is in popular use during arranging and wiring steps of fabrication of a gate array LSI. For instance, an algorithm such as the minicut method and pair linking method is used in the arranging step 122 while an algorithm such as the channel routing method and the labyrinth method is used in the wiring step 123.

FIG. 11 is an explanatory diagram showing the structure of a conventional FPGA manufacturing apparatus for generating the logic function specifying data 22 which are to be given to the configurable semiconductor integrated circuit device 1.

The FPGA manufacturing apparatus is comprised of an interface circuit 51, a data processing device 52, a display 53, a key board 54 and a magnetic disk 55. The data processing device 52 is connected to the logic function specifying data input terminals 4 and the operation mode control terminals 5 of the configurable semiconductor integrated circuit device 1 through the interface circuit 51. Through the logic function specifying data input terminals 4, the operation mode control terminals 5 and the interface circuit 51, the configurable semiconductor integrated circuit device 1 is set into the operation mode and receives the logic function specifying data 22.

The circuitry diagram data 21, which are developed in the logic designing step 11, are stored in the magnetic disk 55. The data processing device 52 runs a predetermined program based on the circuitry diagram data 21 which are stored in the magnetic disk 55 to perform software processing during which the arranging and wiring step 12 is executed to generate the logic function specifying data 22. During this, the logic function specifying data 22 and the like developed on the magnetic disk 55 can be temporarily stored in the data processing device 52.

As input means for observing a processing performed by the data processing device 52, the key board is used. The display 53 acts as output means.

In setting a logic of the configurable semiconductor integrated circuit device 1 using the logic function specifying data 22, the data processing device 52 operates in the following manner.

First, the data processing device 52 routes the operation mode signal which calls for the logic function setting mode to the configurable semiconductor integrated circuit device 1 through the interface circuit 51 and the operation mode control terminals 5.

The data processing device 52 then runs a program for generating the logic function specifying data 22, thereby developing the logic function specifying data 22. The logic function specifying data 22 are then stored in the memory elements 3 of the configurable semiconductor integrated circuit device 1 through the interface circuit 51 and the logic function specifying data input terminals 4. As a result, the configurable semiconductor integrated circuit device 1 is operative to execute a logic function which is defined by the logic function specifying data 22.

Once the operation mode signal which demands the regular operation mode is given to the configurable semiconductor integrated circuit device 1 through the interface circuit 51 and the operation mode control terminals 5, the configurable semiconductor integrated circuit device 1 is operative to receive and output a signal through the regular logic input/output terminals 6 in accordance with the logic function which is defined by the logic function specifying data 22.

FIG. 12 is an explanatory diagram showing the structure of a programmable emulator apparatus which employs the manufacturing apparatus of FIG. 11. In FIG. 12, the programmable emulator apparatus 100 includes a plurality of configurable semiconductor integrated circuit devices 1. Of the regular logic input/output terminals 6 of each configurable semiconductor integrated circuit device 1, some are connected to a connector 7 and some are connected to some of the regular logic input/output terminals 6 of the other configurable semiconductor integrated circuit device 1.

A logic signal analysis device 40 detects, for every given time period, the logic of a signal which is received at an analysis target signal input terminal 41, and outputs what it has detected to the data processing device 52 from its analysis data output terminal 42. The logic signal analysis device 40 operates under the control of a signal which is received at its analysis control signal input/output terminal 43 from the data processing device 52. The analysis target signal input terminal 41 of the logic signal analysis device 40 is connected to some of the regular logic input/output terminals 6 of the configurable semiconductor integrated circuit devices 1.

The logic function specifying data input terminals 4 and the operation mode control terminals 5 of the configurable semiconductor integrated circuit devices 1 are connected to the data processing device 52 through the interface circuit 51. The rest of the structure is similar to that shown in FIG. 11, and therefore, will not be described here.

FIG. 13 is an explanatory diagram showing the sequence of generating the logic function specifying data for the programmable emulator apparatus of FIG. 12.

Likewise in the manufacturing apparatus of FIG. 11, the data processing device 52 is in charge of generation of the logic function specifying data.

Referring to FIG. 13, overall circuitry diagram data 61 are produced which define the whole configurable semiconductor integrated circuit device 1, and then stored on the magnetic disk 55 in an overall logic designing step 81.

Next, in a circuit dividing step 82, the overall circuitry diagram data 61 are divided in such a manner that the divided data can be each stored in each configurable semiconductor integrated circuit device 1. A plurality of divided circuitry diagram data 62 are outputted which correspond to the respective configurable semiconductor integrated circuit devices 1.

Following this, in an arranging and wiring step 83, each of the divided circuitry diagram data 62 are processed by an arranging and wiring treatment, thereby obtaining logic function specifying data 63 which correspond to the respective configurable semiconductor integrated circuit devices 1. The plurality of the logic function specifying data 63 are then temporarily stored on the magnetic disk 55. The arranging and wiring step 83 is performed in a similar manner to which the arranging and wiring step 12 shown in FIG. 10 is performed.

At last, after setting every one of the configurable semiconductor integrated circuit devices 1 into the logic function setting mode, the plurality of the logic function specifying data 63 stored on the magnetic disk 55 are each transferred to the memory elements 3 of the associated configurable semiconductor integrated circuit device 1 through the interface circuit 51, whereby desired logic functions are allotted to the respective configurable semiconductor integrated circuit devices 1.

The configurable semiconductor integrated circuit devices 1 are then set into the regular operation mode as the manufacturing apparatus of FIG. 11 is. Since the connector 7 is connected to the regular logic input/output terminals 6 of the configurable semiconductor integrated circuit devices 1, a signal available from an output terminal of the connector 7 represents aggregation of the logic functions of the configurable semiconductor integrated circuit devices 1. Hence, the signal obtainable from an output terminal of the connector 7 is equivalent to a signal which would be outputted from a large scale logic circuit having a large scale logic function.

Thus, a user can connect the connector 7 to predetermined parts of a target device 45 and regard an input/output signal of the connector 7 of the programmable emulator apparatus of FIG. 12 as an input/output signal of a large scale logic circuit which is under R&D process.

Therefore, by realizing equivalents for the logic functions of the wanted large scale logic circuit on the programmable emulator apparatus of FIG. 12 before actually developing the large scale logic circuit, the wanted logic functions can be evaluated concurrently with verification of the operations of the whole target device.

At the same time and separately from this, operations of the configurable semiconductor integrated circuit devices 1 for every predetermined time duration can be analyzed in detail by the logic signal analysis device 40. It is also possible to store the results of the analysis on the magnetic disk 55 under the control of the data processing device 52 and output the results of analysis on the display 53.

In general, "emulation" refers to manufacturing of a circuit which has the same logic function as that of a target semiconductor integrated circuit device but which is formed by different circuit parts and subsequent evaluation of both the logic function and overall operations of the target device under development, and these manufacturing and evaluation processes are executed before actual fabrication of the target device. A programmable emulator apparatus is capable of performing emulation of various large scale logic circuit only if the logic function specifying data for the configurable semiconductor integrated circuit devices 1 are changed.

Unlike a conventional programmable emulator apparatus in which a standard semiconductor device is assembled hardwired for each different target circuit to perform emulation, the programmable emulator apparatus of FIG. 12 realizes emulation only by changing the logic function specifying data. Hence, in the programmable emulator apparatus of FIG. 12, manual labor involved in emulation is largely reduced.

As heretofore described, fabrication of the conventional configurable semiconductor integrated circuit device requires to store the logic function specifying data in the memory elements of the configurable semiconductor integrated circuit device. For this reason, if a new logic function is to be set, the logic function specifying data 22 for realizing the desired new logic function must be generated by the data processing device 52.

The data processing device 52 is a device for unspecified use. Hence, the data processing device 52 sequentially performs various processings necessary to generate the logic function specifying data 22 on a software processing basis, and therefore, an extremely long time is demanded for development of the logic function specifying data 22. In the programmable emulator apparatus of FIG. 12 which is comprised of a plurality of the configurable semiconductor integrated circuit devices 1, in particular, the processing time increases in proportion to the number of the configurable semiconductor integrated circuit devices 1 employed therein.

SUMMARY OF THE INVENTION

In a first aspect of the present invention, an apparatus for manufacturing a semiconductor integrated circuit device for setting a logic into a configurable semiconductor integrated circuit device, the configurable semiconductor integrated circuit device being loaded with a logic when provided under a logic function specifying mode with logic function specifying data through a logic function specifying data input terminal, the configurable semiconductor integrated circuit device performing, under a regular operation mode and through a regular logic input/output terminal, logic operations which are defined by the logic function specifying data, the configurable semiconductor integrated circuit device receiving the logic function specifying data through the logic function specifying data input terminal, the apparatus comprising: circuit data providing means for providing circuit data which realize a desired logic; and logic function specifying basic data providing means for providing logic function specifying basic data which define basic logics; control means for receiving the circuit data and the logic function specifying basic data, the control means being connected to the logic function specifying data input terminal and the regular logic input/output terminal of the configurable semiconductor integrated circuit device. The control means sets the configurable semiconductor integrated circuit device into the logic function specifying mode and then supplies the logic function specifying basic data to the configurable semiconductor integrated circuit device through the logic function specifying data input terminal so that the configurable semiconductor integrated circuit device is loaded with a logic, the control means thereafter sets the configurable semiconductor integrated circuit device into the regular operation mode to thereby render the configurable semiconductor integrated circuit device capable of performing basic logic operations which are defined by the logic function specifying basic data, the control means then generates logic function specifying final data based on the circuit data during which a part of processings for generating the logic function specifying final data is done by utilizing the basic logic operations of the configurable semiconductor integrated circuit through the regular logic input/output terminal, the control means then sets the configurable semiconductor integrated circuit device into the logic function specifying mode and supplies the logic function specifying final data to the configurable semiconductor integrated circuit device through the logic function specifying data input terminal.

The apparatus may further comprise an operation mode control terminal for receiving an operation mode control signal which invokes the logic function specifying mode and the regular operation mode. The control means, receiving the operation mode control signal, sets the semiconductor integrated circuit device into the logic function specifying mode in response to the operation mode control signal calls for the logic function specifying mode and into the regular operation mode in response to the operation mode control signal calls for regular operation mode.

In a preferred embodiment, the circuit data providing means is first memory means for storing the circuit data, the logic function specifying basic data providing means is second memory means for storing the logic function specifying data, and the apparatus further comprises an interface part which is interposed between the control means and the semiconductor integrated circuit device, the interface part allowing data transfer between the control means and the semiconductor integrated circuit device through the logic function specifying data input terminal, the regular logic input/output terminal and the operation mode control terminal.

The first and second memory means may be magnetic disks, and the control means may be a data processing device which include an input device and an output device and is accessible to the magnetic disks.

The semiconductor integrated circuit device is preferably FPGA (Field Programmable Gate Array).

The input device may be a key board and the output device may be a display.

Thus, in the first aspect of the invention, the control means of the apparatus for manufacturing a semiconductor device utilizes the basic logic operations of the semiconductor integrated circuit device through the regular logic input/output terminal during development of the logic function specifying data based on the circuit data which realize a desired logic function. Hence, processings to be performed by the control means are reduced.

A second aspect of the present invention concerns a method of manufacturing a configurable semiconductor integrated circuit device, the semiconductor integrated circuit device being loaded with a logic when provided under a logic function specifying mode with logic function specifying data through a logic function specifying data input terminal, the configurable semiconductor integrated circuit device performing, under a regular operation mode and through a regular logic input/output terminal, logic operations which are defined by the logic function specifying data, the configurable semiconductor integrated circuit device receiving the logic function specifying data through the logic function specifying data input terminal. The method comprises the steps of: (a) providing circuit data which realize a desired logic; (b) providing logic function specifying basic data which define basic logics; (c) setting the semiconductor integrated circuit device into the logic function specifying mode and providing the semiconductor integrated circuit device with the logic function specifying basic data so as to set a logic into the semiconductor integrated circuit device; (d) setting the semiconductor integrated circuit device into the regular operation mode so as to render the semiconductor integrated circuit device capable of performing basic logic operations which are defined by the logic function specifying basic data; (e) generating logic function specifying final data based on the circuit data during which a part of generation of the logic function specifying basic data is done by utilizing the basic logic operations of the semiconductor integrated circuit device; and (f) setting the semiconductor integrated circuit device into the logic function specifying mode and providing the semiconductor integrated circuit device with the logic function specifying final data.

The circuit data described in the step (a) and the logic function specifying basic data described in the step (b) are preferably data which are stored in the first and the second memory means, respectively.

The steps (c) to (f) are preferably attained by a data processing device which is connected accessible to the first and the second memory means. The step (e) preferably includes the steps of: (e-1) generating the logic function specifying final data only by the data processing device; and (e-2) generating the logic function specifying final data by utilizing the basic logic operations of the semiconductor integrated circuit device.

The semiconductor integrated circuit device preferably includes an operation mode control terminal and a logic function specifying data input terminal. Setting of the logic function specifying mode into the steps (c) and (f) is preferably attained by giving the operation mode control signal an operation mode control signal which calls for the logic function specifying mode, setting of the basic logic function specifying mode at the step (c) and entry of logic function specifying final data at the step (g) are preferably attained through the logic function specifying data input terminal.

The semiconductor integrated circuit device may further include a regular logic input/output terminal, setting of the regular operation mode at the step (d) is attained by giving the operation mode control signal an operation mode control signal which calls for the regular operation mode, and execution of the basic logic operations of the semiconductor integrated circuit device is attained through the regular logic input/output terminal.

In a preferred aspect, the step (e-2) includes the steps of: (e-2-1) inputting computation data by the data processing device to the semiconductor integrated circuit device through the logic function specifying data input terminal; (e-2-2) performing the basic logic operations on the computation data by the semiconductor integrated circuit device to obtain a computation result; (e-2-3) outputting the computation result which is yielded by the semiconductor integrated circuit device to the data processing device through the regular logic input/output terminal; and (e-2-4) generating the logic function specifying final data by the data processing device based on the computation result.

The basic logic operations may be to calculate (X·Y+Z) where X, Y and Z are inputs.

The first and the second memory means may be magnetic disks.

The semiconductor integrated circuit device is preferably FPGA (Field Programmable Gate Array).

Thus, in the method of manufacturing a semiconductor device according to the second aspect of the invention, a part of generation of the logic function specifying data based on the circuit data is attained by utilizing the basic logic operations of the semiconductor integrated circuit device. Hence, the logic function specifying data is efficiently generated based on the circuit data.

In a third aspect of the present invention, an electronic circuit device comprises: a plurality of configurable semiconductor integrated circuit devices, the configurable semiconductor integrated circuit devices being each loaded with a logic when provided under a logic function specifying mode with logic function specifying data through a logic function specifying data input terminal, the configurable semiconductor integrated circuit devices each performing, under a regular operation mode and through a regular logic input/output terminal, logic operations which are defined by the logic function specifying data, the configurable semiconductor integrated circuit devices each receiving the logic function specifying data through the logic function specifying data input terminal; circuit data providing means for providing circuit data which realize a desired logic; and logic function specifying basic data providing means for providing at least one logic function specifying basic data which define basic logics; control means for receiving the circuit data and the logic function specifying basic data, the control means being connected to the logic function specifying data input terminal and the regular logic input/output terminal of each of the semiconductor integrated circuit devices. The control means sets at least one of the semiconductor integrated circuit devices into the logic function specifying mode, the control means then gives the logic function specifying basic data to the least one of the semiconductor integrated circuit devices to set a logic into the least one of the semiconductor integrated circuit devices, the control means then sets the one or more logic-loaded semiconductor integrated circuit devices into the regular operation mode to render the one or more logic-loaded semiconductor integrated circuit devices capable of performing basic logic operations which are defined by the logic function specifying basic data, the control means then divides the circuit data and produces a plurality of divided circuit data, the control means then generates a plurality of logic function specifying final data based on the plurality of divided circuit data, a part of generation of logic function specifying final data being attained by utilizing the basic logic operations of the logic-loaded semiconductor integrated circuit device, the control means then sets the plurality of the semiconductor integrated circuit devices into the logic function specifying mode, the control means then gives the plurality of the logic function specifying final data to the plurality of the semiconductor integrated circuit devices through the regular logic input/output terminals.

The electronic circuit device may further comprise signal connection means which is connected to the regular logic input/output terminals of the plurality of the semiconductor integrated circuit devices, the signal connection means allowing transfer of a signal into the semiconductor integrated circuit devices from outside and transfer of a signal from the semiconductor integrated circuit devices to outside.

The semiconductor integrated circuit devices may each include an operation mode control terminal for receiving an operation mode control signal which invokes the logic function specifying mode and the regular operation mode. The control means, receiving the operation mode control signal, sets the semiconductor integrated circuit device into the logic function specifying mode in response to the operation mode control signal calls for the logic function specifying mode and into the regular operation mode in response to the operation mode control signal calls for regular operation mode.

The circuit data providing means may be first memory means for storing the circuit data, the logic function specifying basic data providing means may be second memory means for storing the logic function specifying data, and the electronic circuit device may further comprise an interface part which is interposed between the control means and the semiconductor integrated circuit devices, the interface part allowing data transfer between the control means and the semiconductor integrated circuit devices through the logic function specifying data input terminal, the regular logic input/output terminal and the operation mode control terminal.

The signal connection means is preferably a connector which is connected to the regular logic input/output terminals of the semiconductor integrated circuit devices and which can be connected to a predetermined target device.

The first and the second memory means are preferably magnetic disks.

The electronic circuit device may further comprise logic signal analyzing means which is connected to the regular logic input/output terminals of the semiconductor integrated circuit devices, the logic signal analyzing means analyzing a logic signal which is received through the regular logic input/output terminals and outputting an analysis result to the data processing device.

The semiconductor integrated circuit device is preferably FPGA (Field Programmable Gate Array).

Preferably, the input device is a key board and the output device is a display.

Thus, in the third aspect of the invention, the control means of the electronic circuit device utilizes the basic logic operations of the logic-loaded semiconductor integrated circuit device through the regular logic input/output terminal during development of a plurality of the logic function specifying data based on a plurality of the divided circuit data. Hence, processings to be performed by the control means are reduced.

A fourth aspect of the invention concerns a method of manufacturing a semiconductor integrated circuit device, configurable semiconductor integrated circuit devices being loaded with a logic when provided under a logic function specifying mode with logic function specifying data through a logic function specifying data input terminal, the semiconductor integrated circuits device performing, under a regular operation mode and through a regular logic input/output terminal, logic operations which are defined by the logic function specifying data, the semiconductor integrated circuit devices receiving the logic function specifying data through the logic function specifying data input terminal. The method comprises the steps of: (a) providing circuit data which realize a desired logic; (b) providing at least one of logic function specifying basic data which define basic logics; (c) setting at least one of the semiconductor integrated circuit devices into the logic function specifying mode and providing the at least one of the semiconductor integrated circuit devices with the logic function specifying basic data so as to set a logic into the at least one of the semiconductor integrated circuit devices; (d) setting the logic-loaded semiconductor integrated circuit devices into the regular operation mode so as to render the logic-loaded semiconductor integrated circuit devices capable of performing basic logic operations which are defined by the logic function specifying basic data; (e) dividing the circuit data and producing a plurality of divided circuit data; (f) generating a plurality of logic function specifying final data based on the plurality of divided circuit data, a part of generation of logic function specifying final data being attained by utilizing the basic logic operations of the logic-loaded semiconductor integrated circuit device; (g) setting the plurality of the semiconductor integrated circuit devices into the logic function specifying mode and thereafter giving the plurality of the logic function specifying final data to the associated semiconductor integrated circuit devices through the regular logic input/output terminals.

Preferably, the circuit data described in the step (a) and the logic function specifying basic data described in the step (b) are data which are stored in the first and the second memory means, respectively.

The steps (c) to (g) may be attained by a data processing device which is connected accessible to the first and the second memory means, the step (f) may include the steps of: (f-1) generating the logic function specifying final data only by the data processing device; and (f-2) generating the logic function specifying final data by utilizing the basic logic operations of the logic-loaded semiconductor integrated circuit device.

The semiconductor integrated circuit devices may each include an operation mode control terminal and a logic function specifying data input terminal, setting of the logic function specifying mode into the steps (c) and (g) may be attained by giving the operation mode control signal an operation mode control signal which calls for the logic function specifying mode, setting of the basic logic function specifying mode at the step (c) and entry of logic function specifying final data at the step (g) may be attained through the logic function specifying data input terminal.

The semiconductor integrated circuit devices may each further include a regular logic input/output terminal, setting of the regular operation mode at the step (d) may be attained by giving the operation mode control signal an operation mode control signal which calls for the regular operation mode, and execution of the basic logic operations of the semiconductor integrated circuit devices may be attained through the regular logic input/output terminal.

In a preferred aspect, the step (f-2) includes the steps of: (f-2-1) inputting computation data by the data processing device to the logic-loaded semiconductor integrated circuit device through the logic function specifying data input terminal; (f-2-2) performing the basic logic operations on the computation data by the logic-loaded semiconductor integrated circuit device to obtain a computation result; (f-2-3) outputting the computation result which is yielded by the logic-loaded semiconductor integrated circuit device to the data processing device through the regular logic input/output terminal; and (f-2-4) generating the logic function specifying final data by the data processing device based on the computation result.

The first and the second memory means may be magnetic disks.

The semiconductor integrated circuit device may be FPGA (Field Programmable Gate Array).

Thus, in the method of manufacturing a semiconductor device according to the fourth aspect of the invention, a part of generation of a plurality of the logic function specifying data based on a plurality of the divided circuit data is attained by utilizing the basic logic operations of the logic-loaded semiconductor integrated circuit devices. Hence, the logic function specifying data is efficiently generated based on the circuit data.

Accordingly, it is an object of the present invention to obtain an apparatus for and a method of manufacturing a configurable semiconductor integrated circuit device which requires less time for fabrication thereof and to offer an electronic circuit device which uses such an apparatus.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
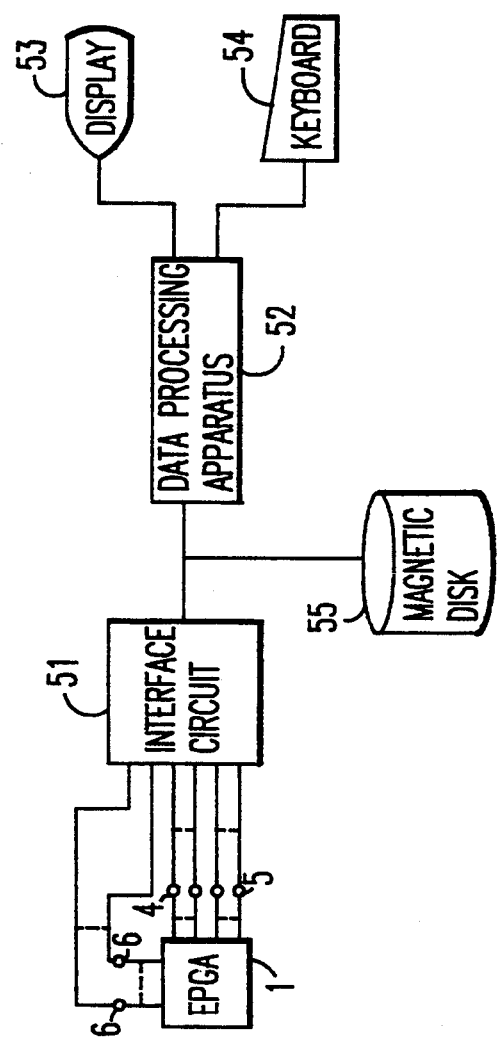
FIG. 1 is a block diagram showing the structure of an apparatus for manufacturing a configurable semiconductor integrated circuit device according to a preferred embodiment of the present invention.

FIG. 1 is a block diagram showing the structure of an apparatus for manufacturing a configurable semiconductor integrated circuit device according to a preferred embodiment of the present invention. As shown in FIG. 1, regular logic input/output terminals 5 of a configurable semiconductor integrated circuit device 1 are connected to a data processing device 52 through an interface circuit 51. Stored on a magnetic disk 55 are circuitry diagram data defining a wanted logic function and logic function specifying basic data defining basic logic functions which can be realized by the configurable semiconductor integrated circuit device 1.

Receiving the logic function specifying basic data, the configurable semiconductor integrated circuit device 1 enters such a state in which the data processing device 52 performs basic logic computation, which is one of the processings necessary to obtain logic function specifying final data from the circuitry diagram data. The computation can be utilized in the data processing device 52 through the regular logic input/output terminals 6 and the interface circuit 51.

Since the configurable semiconductor integrated circuit device 1 is otherwise similar in structure to the conventional configurable semiconductor integrated circuit device, similar description will not be repeated. The inner structure of the configurable semiconductor integrated circuit device 1 is also similar to that of the conventional configurable semiconductor integrated circuit device, and therefore, will not be described here.

Figure 2:
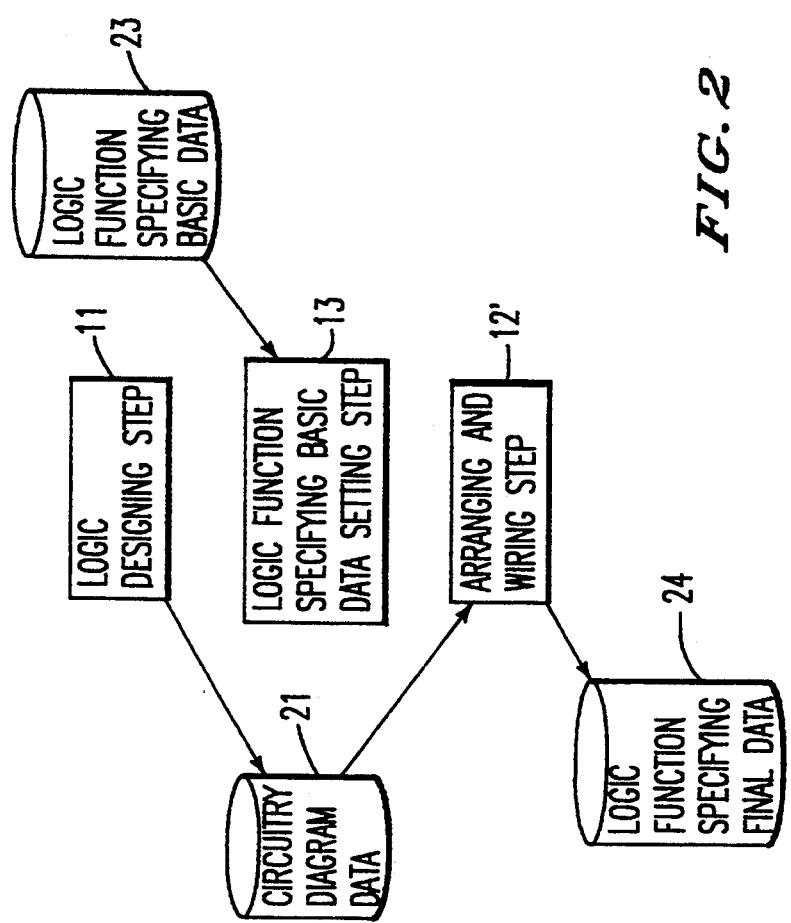
FIG. 2 is an explanatory diagram showing a method of manufacturing the configurable semiconductor integrated circuit device of FIG. 1.

FIG. 2 is an explanatory diagram showing a method of manufacturing the configurable semiconductor integrated circuit device of FIG. 1. Referring to FIG. 2, first, in a logic designing step 11, a logic circuit which realizes a desired logic function is designed in a similar manner in which a regular logic circuit is designed, whereby circuitry diagram data 21 which define the desired logic circuit are generated.

Figure 3:
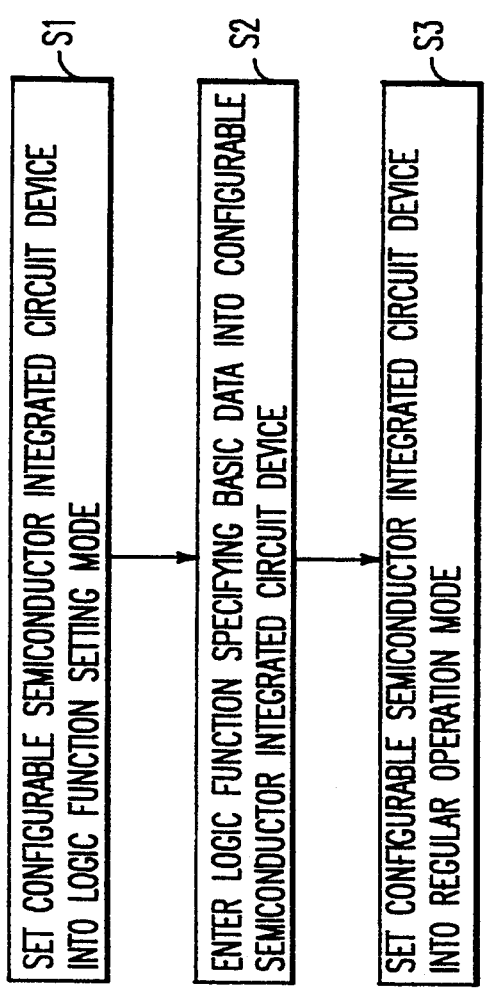
FIG. 3 is a flow chart showing the details of a logic function specifying basic data setting step of the method of FIG. 2.

The flow then proceeds to a logic function specifying basic data setting step 13 which is shown in detail in the flow chart of FIG. 3.

With reference to FIG. 3, first, in Step S1, an operation mode control signal which calls for a logic function setting mode is given to the configurable semiconductor integrated circuit device 1 through the interface circuit 51 and the operation mode control terminals 5 so that the configurable semiconductor integrated circuit device 1 enters the logic function setting mode.

This is followed by Step S2 in which logic function specifying basic data 23 are transferred to memory elements 3 of the configurable semiconductor integrated circuit device 1, to thereby load logic which is defined by the logic function specifying basic data 23 in the configurable semiconductor integrated circuit device 1.

Next, in Step S3, the operation mode control signal which calls for a regular operation mode is given to the configurable semiconductor integrated circuit device 1 through the interface circuit 51 and the operation mode control terminals 5 so that the configurable semiconductor integrated circuit device 1 enters the regular operation mode.

As a result, the configurable semiconductor integrated circuit device 1 is made capable of performing the basic logic operations which are defined by the logic function specifying basic data 23.

Figure 4:
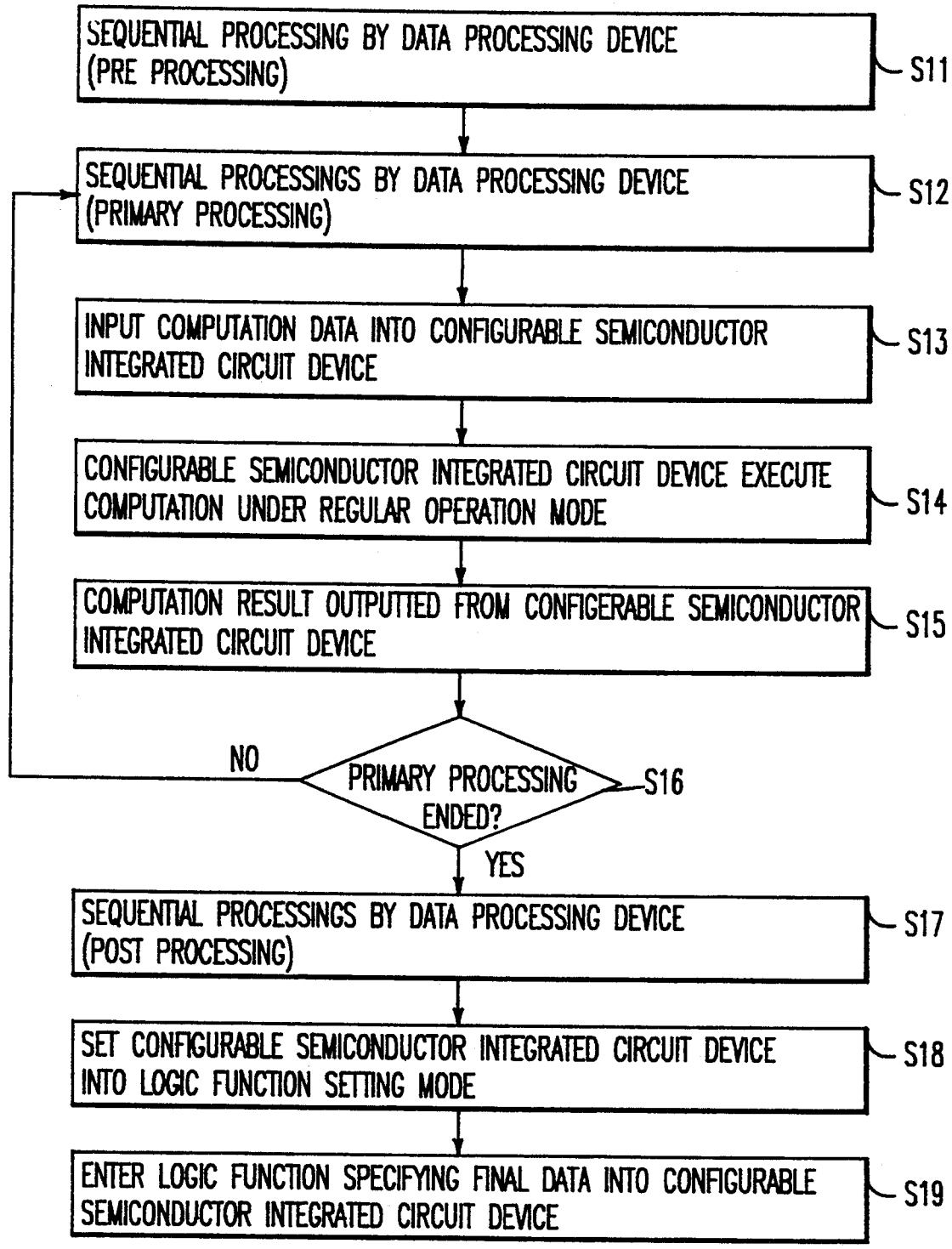
FIG. 4 is a flow chart showing the details of an arranging and wiring step of the method of FIG. 2.

The flow then advances to an arranging and wiring step 12' which is shown in detail in the flow chart of FIG. 4.

As shown in FIG. 4, first, in Step S11, the data processing device 52 sequentially performs predetermined pre-processing.

Figure 10:
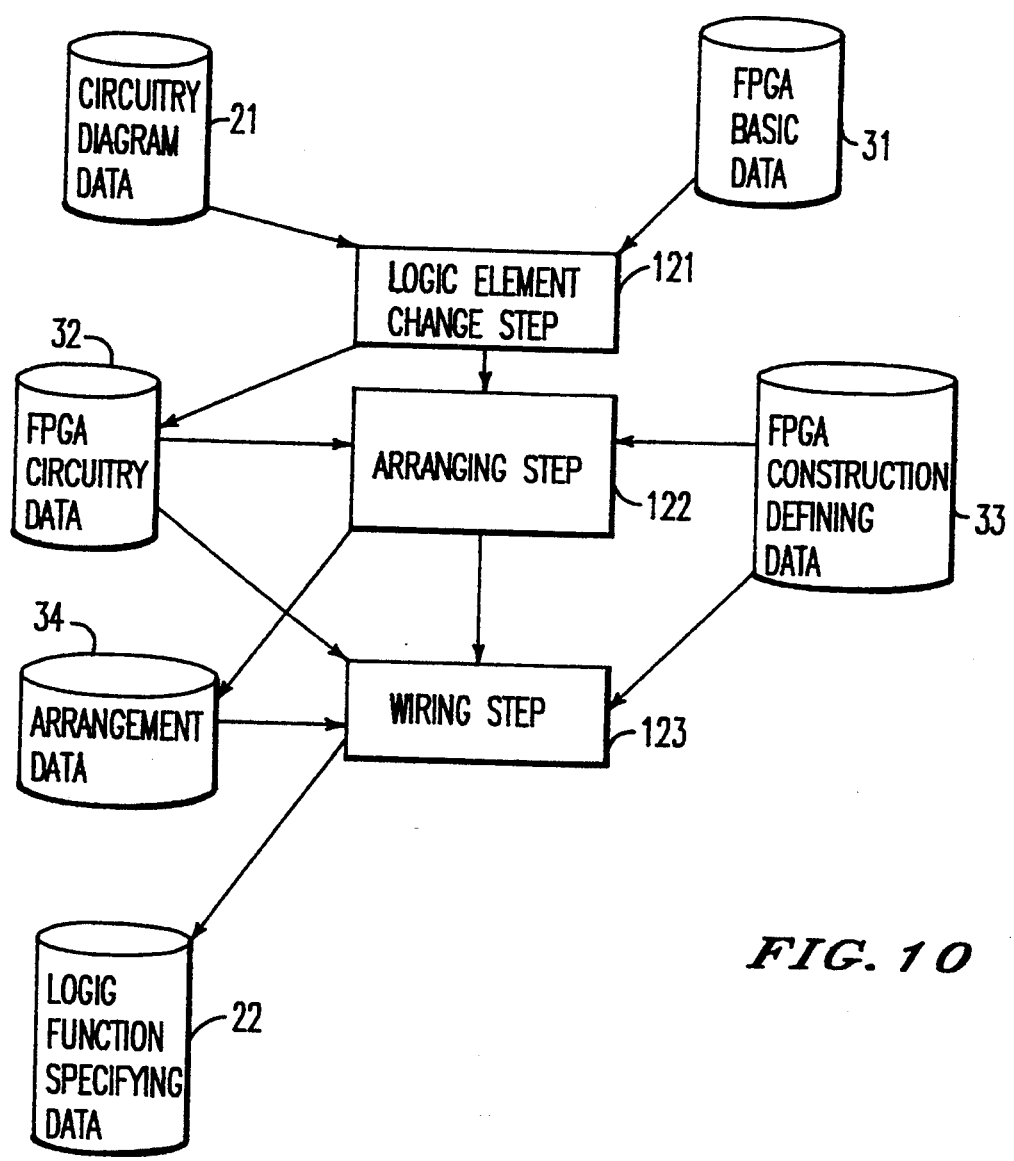
FIG. 10 is an explanatory diagram showing the details of an arranging and wiring step of the method of FIG. 9.
Figure 11:
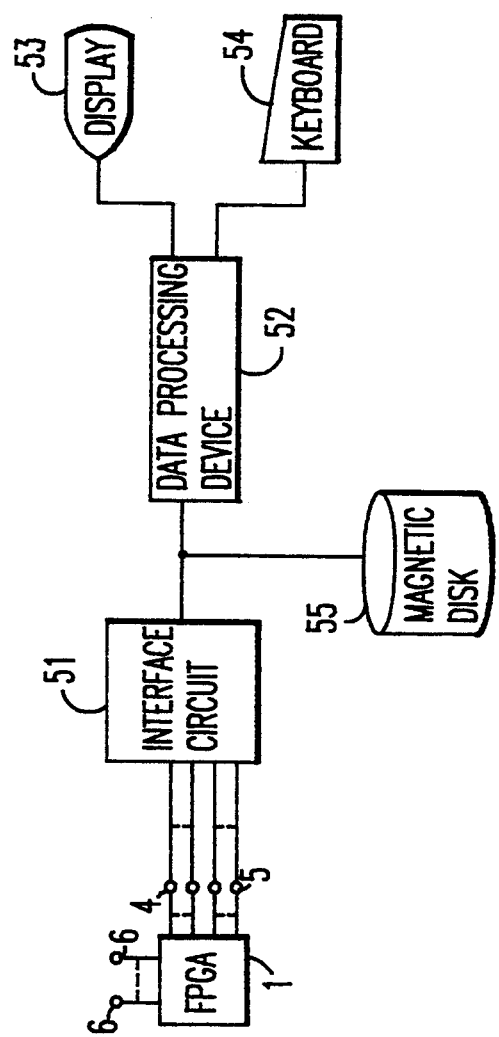
FIG. 11 is a block diagram showing the structure of a conventional apparatus for manufacturing a configurable semiconductor integrated circuit device.

Primary processing, i.e., arranging and wiring which is performed in a similar manner that shown in FIG. 10, follows this (Steps S12 to S16). More precisely, in the primary processing, logic function specifying final data 24 are generated based on the circuitry diagram data 21 through process steps which are similar to the logic element change step 121, the arranging step 122 and the wiring step 123.

The primary processing, a processing to develop the logic function specifying final data 24, is sequentially performed by the data processing device 52 (Step S12). It is also in the primary processing that the logic defined by the logic function specifying basic data 23 is set. The primary processing is performed utilizing the basic logic operations of the configurable semiconductor integrated circuit device 1 which is in the regular operation mode (Steps S13 to S15).

In Step S12, the data processing device 52 performs processings which can be performed only by the data processing device 52 or otherwise performs sequential processings utilizing results of the computation of Steps S13 to S15 performed by the configurable semiconductor integrated circuit device 1.

In Step S13, the configurable semiconductor integrated circuit device 1 is provided, through the interface circuit 51 and the regular logic input/output terminals 6, with data which represent computation that can be performed by the configurable semiconductor integrated circuit device 1.

In Step S14, the configurable semiconductor integrated circuit device 1 which is put into the regular operation mode executes, based on the computation data which are developed in Step S13, the basic logic operations (computation) which are defined by the logic function specifying basic data 23 and yields results of the computation.

Next, in Step S15, the computation results obtained in Step S14 are outputted to the data processing device 52 through the regular logic input/output terminals 6 and the interface circuit 51.

The data processing device 52 continues sequential processings (Step S12) while the configurable semiconductor integrated circuit device 1 alike continues the computation (Steps S13 to S15) until completion of the primary processing is confirmed in Step S16.

If completion of the primary processing (generation of the logic function specifying final data 24) is confirmed in Step S16, the data processing device 52 sequentially performs certain post-processing in Step S17. The flow then proceeds to Step S18.

In Step S18, the operation mode control signal which calls for logic function setting mode is given to the configurable semiconductor integrated circuit device 1 through the interface circuit 51 and the operation mode control terminals 5. As a result, the configurable semiconductor integrated circuit device 1 enters the logic function setting mode.

Thereafter, in Step S19, the generation of the logic function specifying final data 24 which are developed in Steps S12 to S16 are stored in the memory elements 3 of the configurable semiconductor integrated circuit device 1 through the interface circuit 51 and the logic function specifying data input terminals 4, whereby a logic defined by the logic function specifying final data 24 is set in the configurable semiconductor integrated circuit device 1.

Figure 5:
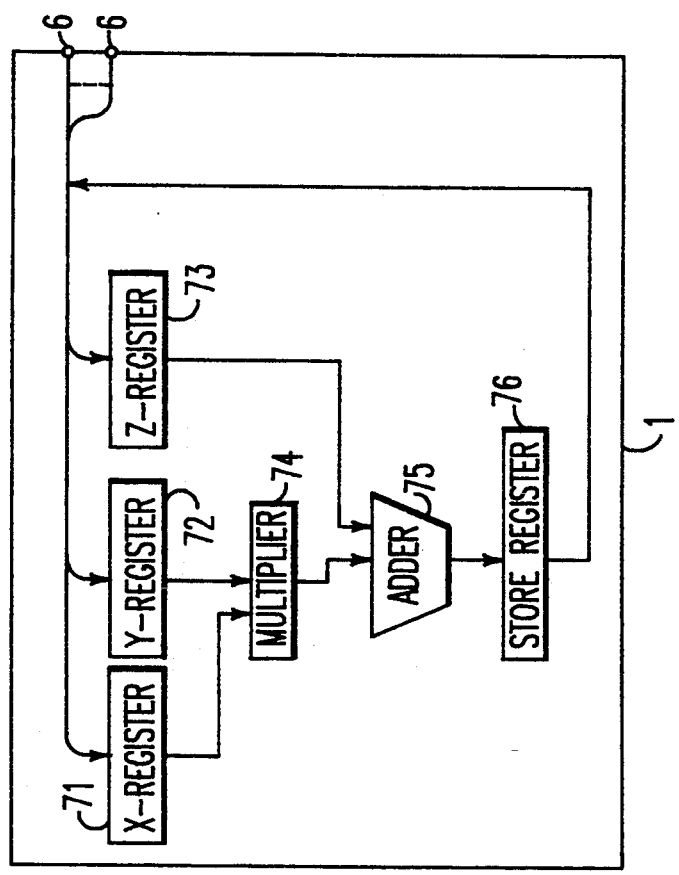
FIG. 5 is an explanatory diagram showing a configurable semiconductor integrated circuit device.

FIG. 5 is an explanatory diagram showing an example of the inner structure of the configurable semiconductor integrated circuit device 1 into which the logic defined by the logic function specifying final data 24 is loaded. As shown in FIG. 5, an X-register 71, a Y-register 72 and a Z-register 73 are provided which receive a signal from the regular logic input/output terminals 6. Outputs from the X- and Y-registers 71 and 72 are coupled to an input part of a multiplier 74. Outputs from the multiplier 74 and the Z-register 73 are coupled to an input part of an adder 75. An output from the adder 75 is received by a store register 76 whose output is coupled to the regular logic input/output terminals 6.

In the configurable semiconductor integrated circuit device 1 tailored as that shown in FIG. 5, when numbers X, Y and Z are stored in the X-, Y- and Z-registers 71, 72 an 73, respectively, through the regular logic input/output terminals 6, a result of computation (X·Y+Z) is loaded in the store register 76. Hence, the computation result is obtainable through the regular logic input/output terminals 6.

In other words, the computation (X·Y+Z) can be left to the configurable semiconductor integrated circuit device 1. This can be done by carrying out steps of: storing the number X in the X-register 71; storing the number Y in the Y-register 72; storing the number Z in the Z-register 73; and reading a result of the computation (X·Y+Z) from the store register 76.

The computation (X·Y+Z) is frequently repeated in calculation using a performance function in algorithm which is required in various steps such as the arranging step and the wiring step. Hence, by performing the computation (X·Y+Z) in the configurable semiconductor integrated circuit device 1, generation of the logic function specifying final data 24 is largely reduced since the computation (X·Y+Z), which has been performed by the data processing device 52 on a software basis, is done on a hardware basis by the configurable semiconductor integrated circuit device 1.

Figure 6:
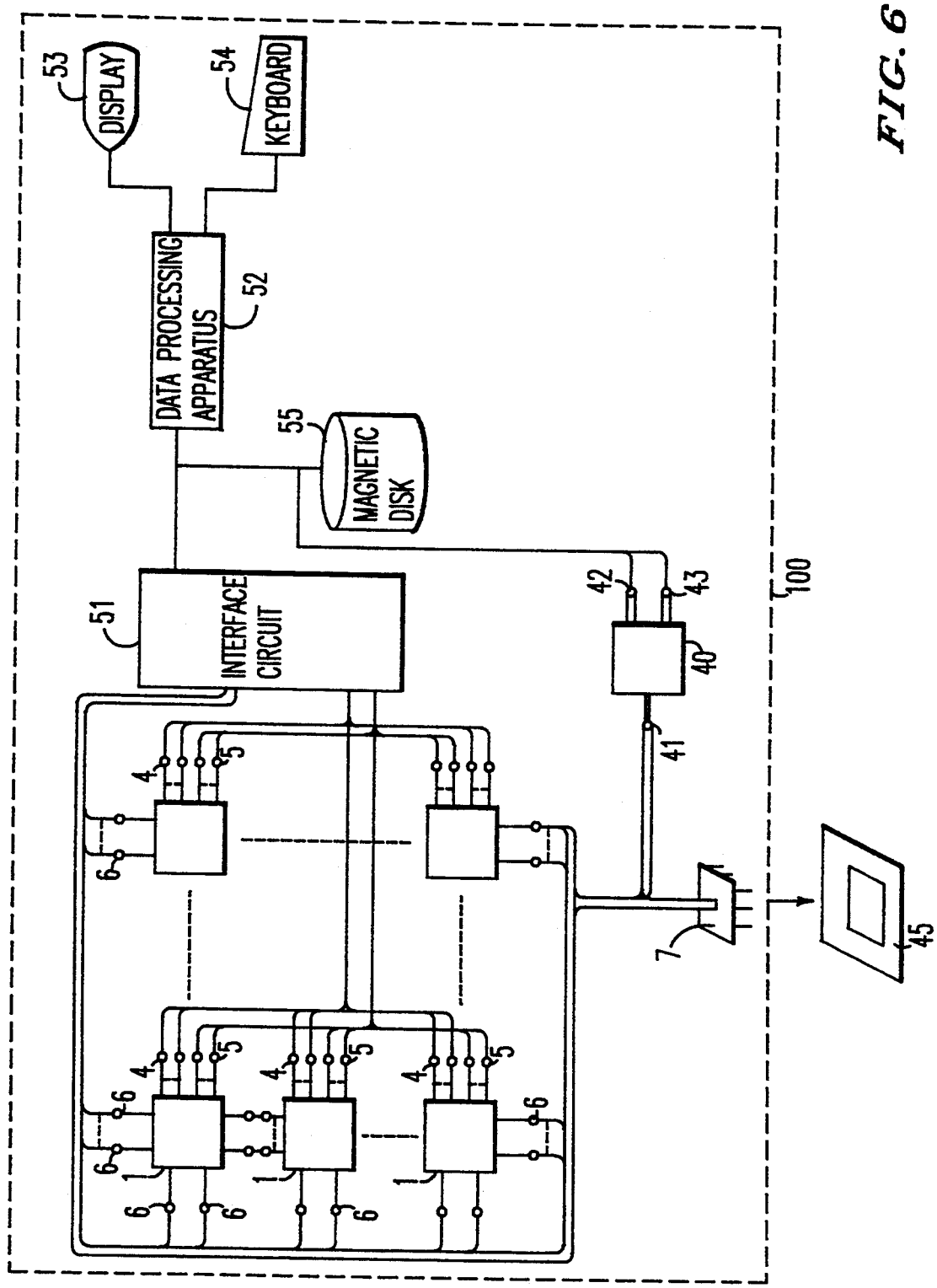
FIG. 6 is an explanatory diagram showing the structure of a programmable emulator apparatus which employs the manufacturing apparatus of FIG. 1.

FIG. 6 is an explanatory diagram showing the structure of a programmable emulator apparatus 100' which employs the manufacturing apparatus of FIG. 1.

Figure 12:
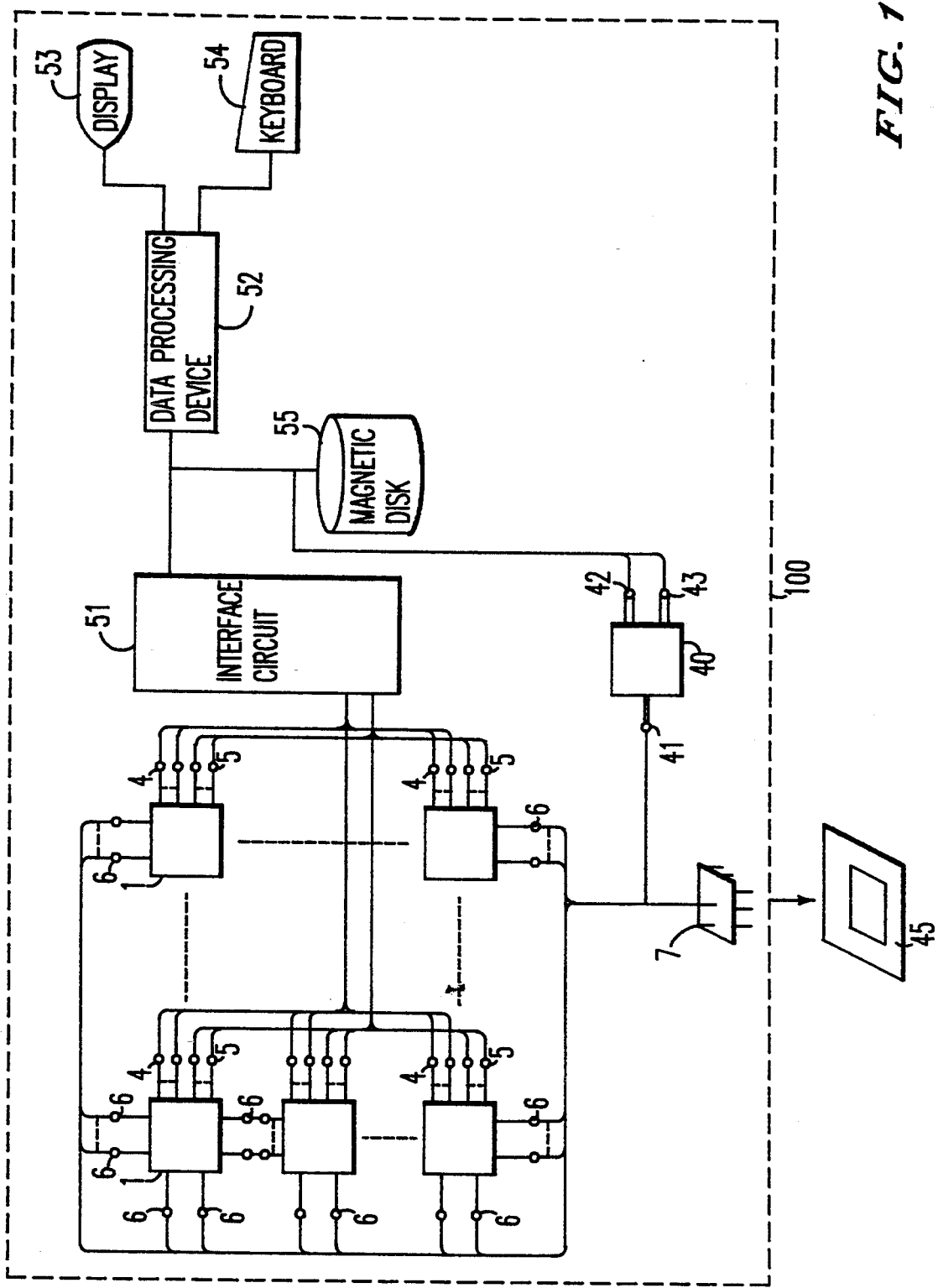
FIG. 12 is an explanatory diagram showing the structure of a programmable emulator apparatus which employs the manufacturing apparatus of FIG. 11.
Figure 13:
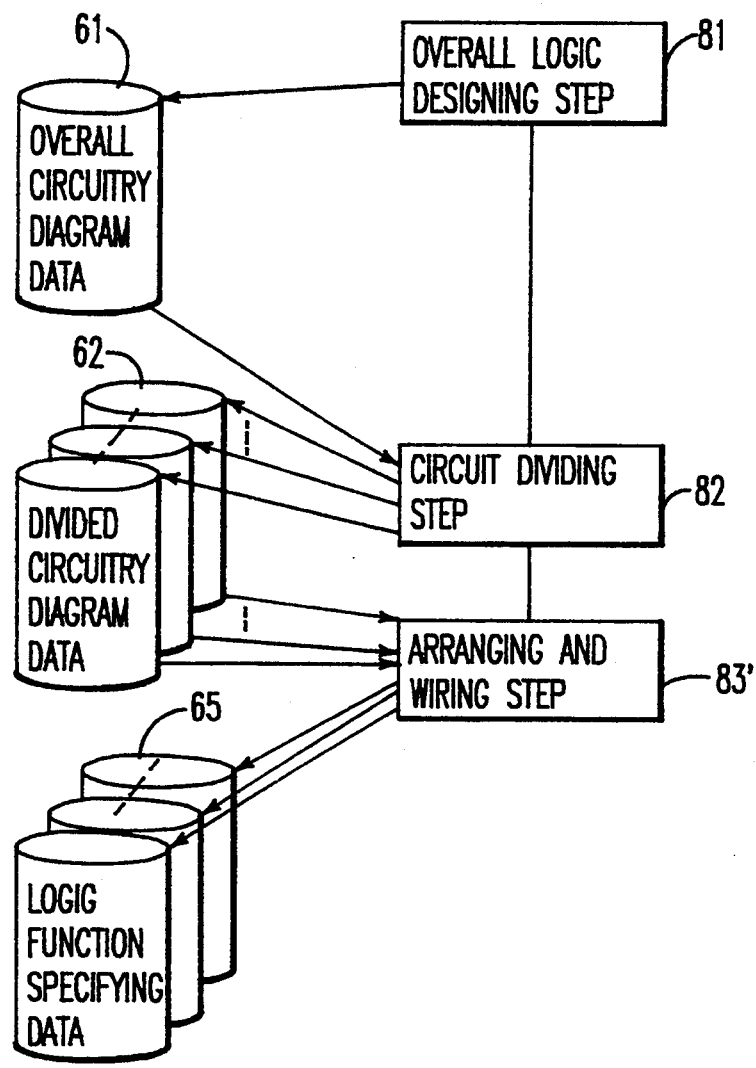
FIG. 13 is an explanatory diagram showing a method of manufacturing the configurable semiconductor integrated circuit device employed in the programmable emulator apparatus of FIG. 11.

In FIG. 6, the interface circuit 51 is connected to the regular logic input/output terminals 6 of all the configurable semiconductor integrated circuit devices 1. Stored on the magnetic disk 55 are at least one logic function specifying basic data which define a basic logic function which is attainable by at least one of the configurable semiconductor integrated circuit devices 1. The programmable emulator apparatus 100' has otherwise similar structure to that of the conventional programmable emulator apparatus of FIG. 12.

Figure 7:
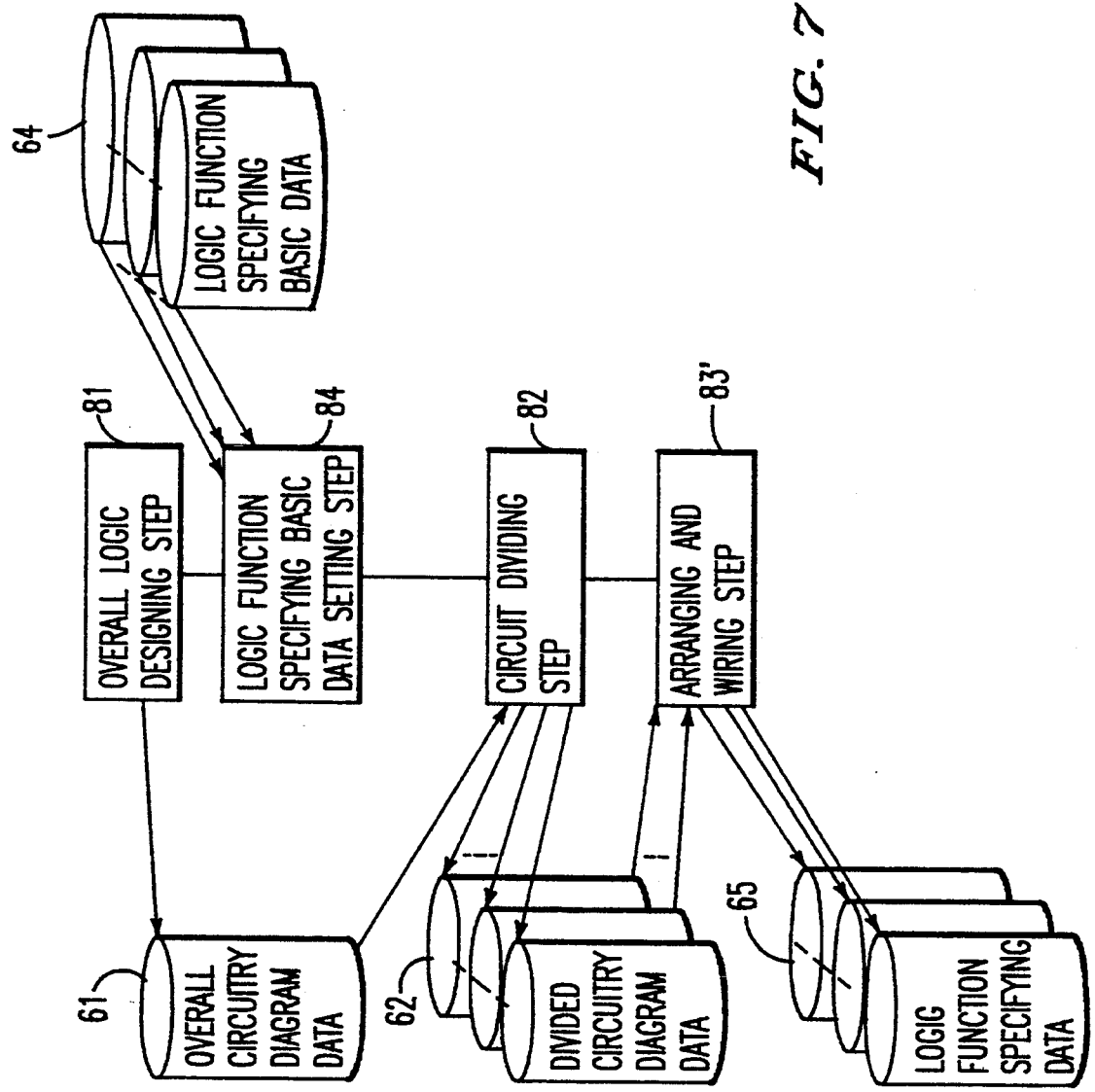
FIG. 7 is an explanatory diagram showing a method of manufacturing the configurable semiconductor integrated circuit device employed in the programmable emulator apparatus of FIG. 6.
Figure 8:
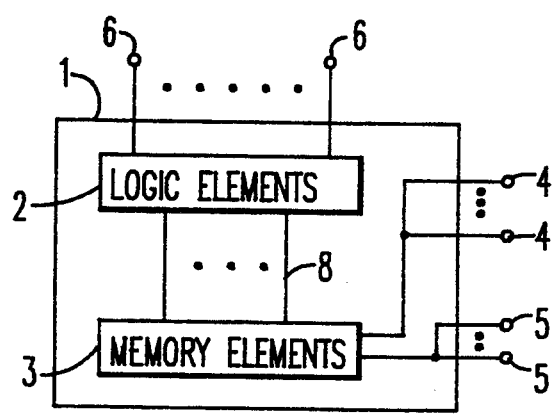
FIG. 8 is a block diagram showing the structure of the configurable semiconductor integrated circuit device.
Figure 9:
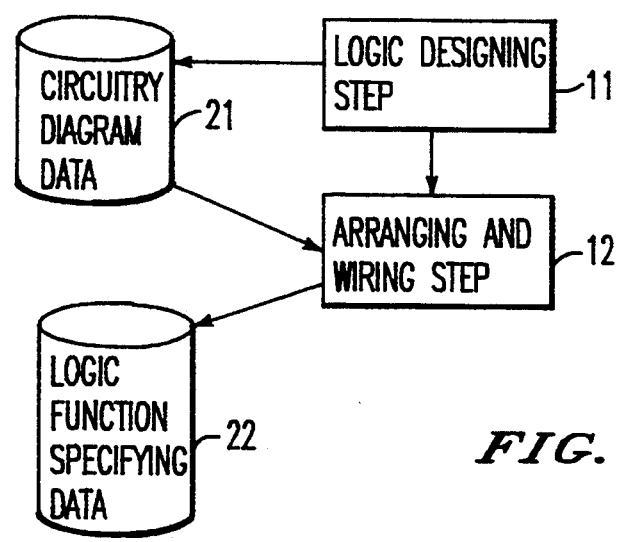
FIG. 9 is an explanatory diagram showing a conventional method of manufacturing a configurable semiconductor integrated circuit device.

FIG. 7 is an explanatory diagram showing how the logic function specifying final data are developed in the programmable emulator apparatus of FIG. 6.

Referring to FIG. 7, first, in an overall logic designing step 81, a logic circuit which realizes a desired logic function is designed as is done in designing a logic circuit of a regular LSI device, whereby overall circuitry diagram data 61 are generated which define the desired logic circuit.

Next, in a logic function specifying basic data setting step 84, the data processing device 52 provides all the configurable semiconductor integrated circuit devices 1 with the operation mode control signal which calls for the logic function setting mode through the interface circuit 51 and the operation mode control terminals 5. This allows that the configurable semiconductor integrated circuit devices 1 all enter the logic function setting mode.

The data processing device 52 then transfers logic function specifying basic data 64 to the associated ones of the configurable semiconductor integrated circuit devices 1. Consequently, logics which are defined by the logic function specifying basic data 64 are set.

If any of the configurable semiconductor integrated circuit devices 1 has no logic to receive which is defined by the logic function specifying basic data 64, that particular configurable semiconductor integrated circuit device 1 needs not to be set into the logic function setting mode or loaded with the logic of the logic function specifying basic data 64.

Following this, the data processing device 52, through the interface circuit 51 and the operation mode control terminals 5, provides all the configurable semiconductor integrated circuit devices 1 with the operation mode control signal which calls for the regular operation mode so that every configurable semiconductor integrated circuit device 1 enters the regular operation mode.

As a result, of the configurable semiconductor integrated circuit devices 1 of the programmable emulator apparatus, those logic-loaded devices to which the logics of the logic function specifying basic data 23 are set are now capable of performing the basic logic operations which are defined by the logic function specifying basic data 64.

If any of the configurable semiconductor integrated circuit devices 1 has no logic to receive which is defined by the logic function specifying basic data 64, that particular configurable semiconductor integrated circuit device 1 needs not to be set into the regular operation mode.

Next, in a circuit dividing step 82, the data processing device 52 divides the overall circuitry diagram data 61 in such a manner that the divided data can be each stored in each configurable semiconductor integrated circuit device 1. A plurality of divided circuitry diagram data 62 are outputted which correspond to the respective configurable semiconductor integrated circuit devices 1 to be thereafter stored on the magnetic disk 55.

In an arranging and wiring step 83', the data processing device 52 then stores divided circuitry diagram data 62 on the magnetic disk 55, and a plurality of logic function specifying final data 65 are generated based on the respective divided circuitry diagram data 62 which correspond to the respective configurable semiconductor integrated circuit devices 1.

During this, by performing process steps which are similar to the steps S12 to S16 of FIG. 4, instead of the data processing device 52, any of the logic-loaded configurable semiconductor integrated circuit devices 1 performs the basic logic operation which can be done by the configurable semiconductor integrated circuit devices 1. Results of the computation are utilized by the data processing device 52.

Thus, the computation which has been performed by the data processing device 52 on a software processing basis is performed by the configurable semiconductor integrated circuit devices 1 on a hardware basis, contributing a drastic reduction in time required for developing the logic function specifying final data 65.

The logic function specifying final data 65 thus created, which correspond to the configurable semiconductor integrated circuit devices 1, are temporarily transferred onto the magnetic disk 55.

The data processing device 52 then, through the interface circuit 51 and the operation mode control terminals 5, provides all the configurable semiconductor integrated circuit devices 1 with the logic function setting mode control signal which calls for the regular operation mode so that every configurable semiconductor integrated circuit device 1 enters the logic function setting mode.

Next, the logic function specifying final data 65 stored on the magnetic disk 55 are transferred to the memory elements 3 of the associated configurable semiconductor integrated circuit devices 1 through the interface circuit 51 and the logic function specifying data input terminals 4 so that the configurable semiconductor integrated circuit devices 1 are each loaded with a desired logic function.

Following this, the data processing device 52 gives the logic function setting mode control signal which calls for the regular operation mode to the configurable semiconductor integrated circuit devices 1 through the interface circuit 51 and the operation mode control terminals 5, thereby the configurable semiconductor integrated circuit devices 1 returning to the regular operation mode. In response to this, since the connector 7 is connected to the regular logic input/output terminals 6 of the configurable semiconductor integrated circuit devices 1, a signal available from an output terminal of the connector 7 represents aggregation of the logic functions of the configurable semiconductor integrated circuit devices 1. Hence, the signal obtainable from an output terminal of the connector 7 is equivalent to a signal which would be outputted from a large scale logic circuit having a large scale logic function.

Thus, a user can connect the connector 7 to predetermined parts of a target device 45 and regard an input/output signal of the connector 7 of the programmable emulator apparatus of FIG. 6 as an input/output signal of a large scale logic circuit which is under R&D process.

Therefore, by realizing equivalents for the logic functions of the wanted large scale logic circuit on the programmable emulator apparatus of FIG. 6 before actually developing the large scale logic circuit, the wanted logic functions can be evaluated concurrently with verification of the operations of the whole target device.

At the same time and separately from this, operations of the configurable semiconductor integrated circuit devices 1 for every predetermined time duration can be analyzed in detail by the logic signal analysis device 40. It is also possible to store the results of the analysis on the magnetic disk 55 under the control of the data processing device 52 and output the results of analysis on the display 53.

While the invention has been described in detail, the foregoing description is in all aspects illustrative and not restrictive. It is understood that numerous other modifications and variations can be devised without departing from the scope of the invention.

I claim:

1. A method of manufacturing a configurable semiconductor integrated circuit device, said semiconductor integrated circuit device being loaded with a logic when provided under a logic function specifying mode with logic function specifying data through a logic function specifying data input terminal, said configurable semiconductor integrated circuit device performing, under a regular operation mode and through a regular logic input/output terminal, logic operations which are defined by said logic function specifying data, said configurable semiconductor integrated circuit device receiving said logic function specifying data through said logic function specifying data input terminal, said method comprising the steps of:

(a) providing logic circuit data;

(b) providing logic function specifying basic data which define basic logics;

(c) setting said semiconductor integrated circuit device into said logic function specifying mode and providing said semiconductor integrated circuit device with said logic function specifying basic data so as to set said basic logics into said semiconductor integrated circuit device;

(d) setting said semiconductor integrated circuit device into said regular operation mode so as to render said semiconductor integrated circuit device capable of performing basic logic operations which are defined by said logic function specifying basic data;

(e) generating logic function specifying final data based on said logic circuit data, a part of said generating logic function specifying final data being attained by utilizing said basic logic operations of said semiconductor integrated circuit device; and (f) setting said semiconductor integrated circuit device into said logic function specifying mode and providing said semiconductor integrated circuit device with said logic function specifying final data.

2. The method of claim 1, wherein said circuit data described in said step (a) and said logic function specifying basic data described in said step (b) are data which are stored in first and second memory means, respectively.

3. The method of claim 2, wherein
said steps (c) to (f) are attained by a data processing device which is connected accessible to said first and said second memory means,
said step (e) includes the steps of:
(e-1) generating said logic function specifying final data only by said data processing device; and
(e-2) generating said logic function specifying final data by utilizing said basic logic operations of said semiconductor integrated circuit device.

4. The method of claim 3, wherein said semiconductor integrated circuit device includes an operation mode control terminal and a logic function specifying data input terminal, setting of said logic function specifying mode into said steps (c) and (f) is attained by giving said operation mode control terminal an operation mode control signal which calls for said logic function specifying mode, setting of said basic logic function specifying mode at said step (c) and entry of said logic function specifying final data at said step (g) are attained through said logic function specifying data input terminal.

5. The method of claim 4, wherein
said semiconductor integrated circuit device further includes a regular logic input/output terminal, setting of said regular operation mode at said step (d) is attained by giving said operation mode control signal terminal an operation mode control signal which calls for a regular operation mode, and execution of said basic logic operations of said semiconductor integrated circuit device is attained through said regular logic input/output terminal.

6. The method of claim 5, wherein said step (e-2) includes the steps of:

(e-2-1) inputting computation data by said data processing device to said semiconductor integrated circuit device through said logic function specifying data input terminal;

(e-2-2) performing said basic logic operations on said computation data by said semiconductor integrated circuit device to obtain a computation result;

(e-2-3) outputting said computation result which is yielded by said semiconductor integrated circuit device to said data processing device through said regular logic input/output terminal; and (e-2-4) generating said logic function specifying final data by said data processing device based on said computation result.

7. The method of claim 6, wherein said basic logic operations is to calculate (X·Y+Z) where X, Y and Z are inputs.

8. The method of claim 7, wherein said first and said second memory means are magnetic disks.

9. The method of claim 8, wherein said semiconductor integrated circuit device is FPGA (Field Programmable Gate Array).

10. A method of manufacturing a semiconductor integrated circuit device, configurable semiconductor integrated circuit devices being loaded with a logic when provided under a logic function specifying mode with logic function specifying data through a logic function specifying data input terminal, said semiconductor integrated circuits device performing, under a regular operation mode and through a regular logic input/output terminal, logic operations which are defined by said logic function specifying data, said semiconductor integrated circuit devices receiving said logic function specifying data through said logic function specifying data input terminal, said method comprising the steps of:

(a) providing circuit data which realize a desired logic;

(b) providing at least one of logic function specifying basic data which define basic logics;

(c) setting at least one of said semiconductor integrated circuit devices into said logic function specifying mode and providing said at least one of said semiconductor integrated circuit devices with said logic function specifying basic data so as to set a logic into said at least one of said semiconductor integrated circuit devices;

(d) setting logic-loaded semiconductor integrated circuit devices into said regular operation mode so as to render said logic-loaded semiconductor integrated circuit devices capable of performing basic logic operations which are defined by said logic function specifying basic data;

(e) dividing said circuit data and producing a plurality of divided circuit data;

(f) generating a plurality of logic function specifying final data based on said plurality of divided circuit data, a part of said generating a plurality of logic function specifying final data being attained by utilizing said basic logic operations of said logic-loaded semiconductor integrated circuit device;

(g) setting said plurality of said semiconductor integrated circuit devices into said logic function specifying mode and thereafter giving said plurality of said logic function specifying final data to the associated semiconductor integrated circuit devices through said regular logic input/output terminals.

11. The method of claim 10, wherein said circuit data described in said step (a) and said logic function specifying basic data described in said step (b) are data which are stored in said first and second memory means, respectively.

12. The method of claim 11, wherein
said steps (c) to (g) are attained by a data processing device which is connected accessible to said first and said second memory means, said step (f) includes the steps of:

(f-1) generating said logic function specifying final data only by said data processing device; and (f-2) generating said logic function specifying final data by utilizing said basic logic operations of said logic-loaded semiconductor integrated circuit device.

13. The method of claim 12, wherein
said semiconductor integrated circuit devices each include an operation mode control terminal and a logic function specifying data input terminal, setting of said logic function specifying mode into said steps (c) and (g) is attained by giving said operation mode control signal terminal an operation mode control signal which calls for said logic function specifying mode, setting of said basic logic function specifying mode at said step (c) and entry of said plurality of logic function specifying final data at said step (g) are attained through said logic function specifying data input terminal.

14. The method of claim 13, wherein
said semiconductor integrated circuit devices each further include a regular logic input/output terminal, setting of said regular operation mode at said step (d) is attained by giving said operation mode control signal terminal an operation mode control signal which calls for a regular operation mode, and execution of said basic logic operations of said semiconductor integrated circuit devices is attained through said regular logic input/output terminal.

15. The method of claim 14, wherein said step (f-2) includes the steps of:

(f-2-1) inputting computation data by said data processing device to said logic-loaded semiconductor integrated circuit device through said logic function specifying data input terminal;

(f-2-2) performing said basic logic operations on said computation data by said logic-loaded semiconductor integrated circuit device to obtain a computation result;

(f-2-3) outputting said computation result which is yielded by said logic-loaded semiconductor integrated circuit device to said data processing device through said regular logic input/output terminal; and (f-2-4) generating said logic function specifying final data by said data processing device based on said computation result.

16. The method of claim 15, wherein said first and said second memory means are magnetic disks.

17. The method of claim 16, wherein said semiconductor integrated circuit device is FPGA (Field Programmable Gate Array).

* * * * *